(12) United States Patent
Tanabe

(10) Patent No.: US 12,222,278 B2
(45) Date of Patent: Feb. 11, 2025

(54) ENVIRONMENTAL TESTING DEVICE WITH ENHANCED ELECTROMAGNETIC EFFECT

(71) Applicant: ESPEC CORP., Osaka (JP)

(72) Inventor: Masatoshi Tanabe, Osaka (JP)

(73) Assignee: ESPEC CORP., Osaka (JP)

( * ) Notice: Subject to any disclaimer, the term of this patent is extended or adjusted under 35 U.S.C. 154(b) by 268 days.

(21) Appl. No.: 17/818,238

(22) Filed: Aug. 8, 2022

(65) Prior Publication Data

US 2023/0048061 A1  Feb. 16, 2023

(30) Foreign Application Priority Data

Aug. 11, 2021 (JP) ................. 2021-131223

(51) Int. Cl.
*G01N 17/00* (2006.01)
*G01N 25/18* (2006.01)
*H05K 9/00* (2006.01)

(52) U.S. Cl.
CPC ........... *G01N 17/002* (2013.01); *G01N 25/18* (2013.01); *H05K 9/0007* (2013.01)

(58) Field of Classification Search
CPC ..... G01N 17/002; G01N 25/18; H05K 9/0007
See application file for complete search history.

(56) References Cited

U.S. PATENT DOCUMENTS

| | | | |
|---|---|---|---|
| 8,557,572 B2 | 10/2013 | Kobayashi et al. | |
| 10,620,113 B2 * | 4/2020 | Yoshida | G01M 99/002 |
| 10,808,946 B2 | 10/2020 | Baker et al. | |
| 2009/0227008 A1 | 9/2009 | Busujima | |
| 2010/0173401 A1 | 7/2010 | Kobayashi et al. | |
| 2012/0258528 A1 | 10/2012 | Kobayashi et al. | |
| 2012/0264201 A1 | 10/2012 | Kobayashi et al. | |
| 2018/0216833 A1 | 8/2018 | Baker et al. | |

FOREIGN PATENT DOCUMENTS

| | | | | |
|---|---|---|---|---|
| CN | 111097557 A | | 5/2020 | |
| CN | 108693063 B | * | 5/2021 | ............ G01N 17/00 |
| CN | 115436211 A | * | 12/2022 | |
| JP | H01-107199 U | | 7/1989 | |

(Continued)

OTHER PUBLICATIONS

The extended European search report issued by the European Patent Office on Apr. 11, 2023, which corresponds to European Patent Application No. 17/818,238-1016 and is related to U.S. Appl. No. 17/818,238.

(Continued)

*Primary Examiner* — Andre J Allen
(74) *Attorney, Agent, or Firm* — Studebaker & Brackett PC

(57) ABSTRACT

An environmental testing device includes a heat insulation chamber that includes a test chamber and is formed using a heat insulation panel that is electrically conductible. The heat insulation chamber includes a chamber body having an entrance and a door that opens and closes the entrance. A heat insulation panel forming the chamber body includes an outer panel and an inner panel. A radiation-absorbent material is disposed between the outer panel and the inner panel. The heat insulation panel forming the chamber body and a heat insulation panel forming the door are connected to each other in an electrically conductible manner.

17 Claims, 13 Drawing Sheets

(56) References Cited

FOREIGN PATENT DOCUMENTS

| | | | |
|---|---|---|---|
| JP | H07-270303 A | | 10/1995 |
| JP | 2004-108807 A | | 4/2004 |
| JP | 2005-114377 A | | 4/2005 |
| JP | 3909052 B2 | * | 4/2007 |
| JP | 2008-034538 A | | 2/2008 |
| JP | 2008166474 A | * | 7/2008 |
| JP | 2013-009005 A | | 1/2013 |
| JP | 2018179829 A | * | 11/2018 |
| KR | 100978831 B1 | * | 8/2010 |
| KR | 10-2012602 B1 | | 8/2019 |
| TW | 552412 B | * | 9/2003 |
| WO | 2007/111105 A1 | | 10/2007 |

OTHER PUBLICATIONS

An Office Action; "Notice of Reasons for Refusal," mailed by the Japanese Patent Office on Apr. 2, 2024, which corresponds to Japanese Patent Application No. 2021-131223 and is related to U.S. Appl. No. 17/818,238; with English language translation.

* cited by examiner

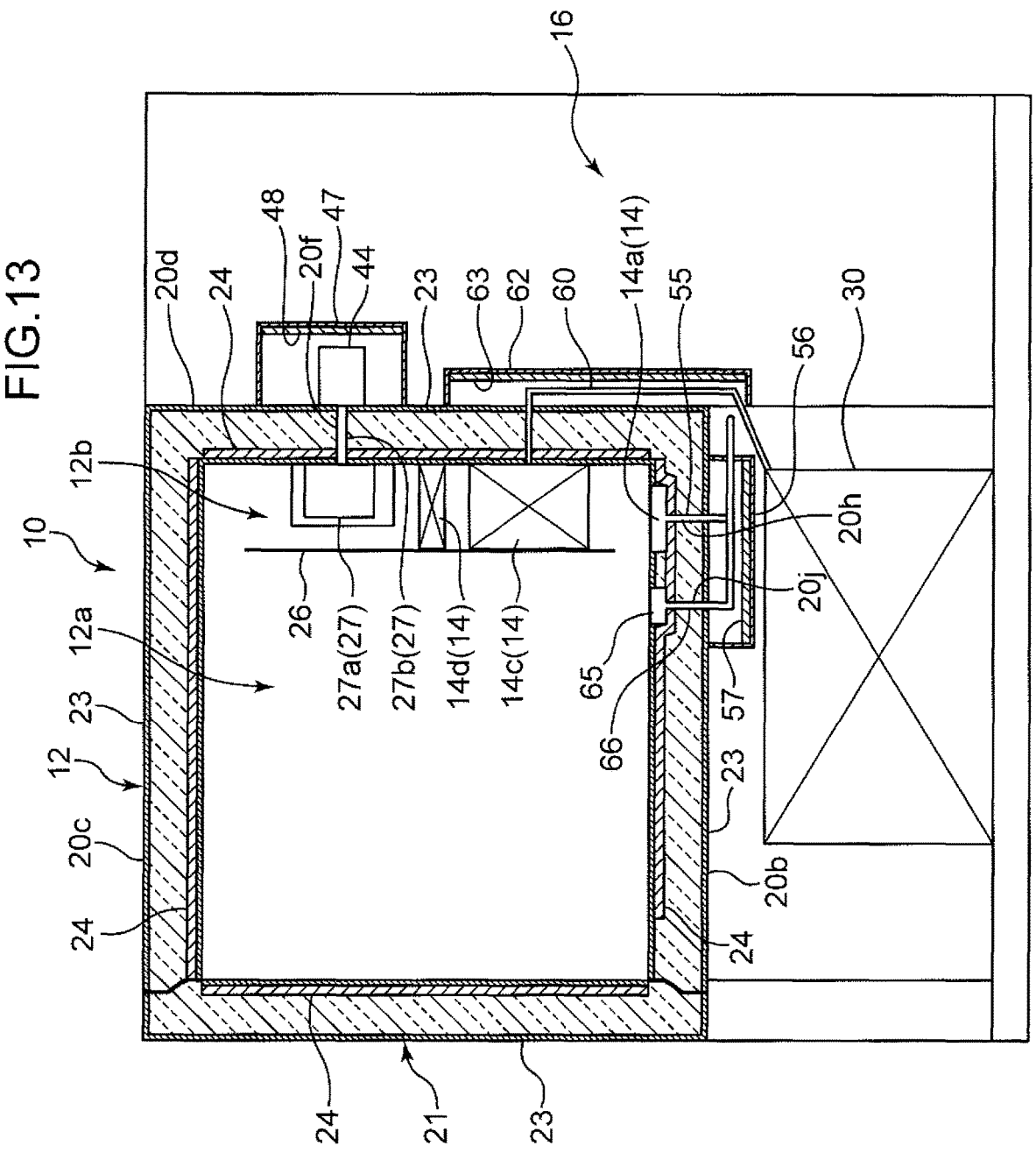

ENVIRONMENTAL TESTING DEVICE WITH ENHANCED ELECTROMAGNETIC EFFECT

FIELD OF THE INVENTION

The present invention relates to an environmental testing device.

BACKGROUND ART

Conventionally, as disclosed in Japanese Patent Application Laid-Open No. 7-270303, an environmental testing device for performing an environmental test of a test piece is known. The environmental testing device is configured as, for example, a temperature chamber, a temperature humidity chamber, a thermal cycle chamber, or the like. In the environmental testing device, a test chamber in which a test piece is disposed is configured as a space surrounded by a chamber body and a door that opens and closes a front opening of the chamber body. The chamber body and the door are each formed of a heat insulation wall. The heat insulation wall includes a metal plate constituting an inner wall, a metal plate constituting an outer wall, and a heat insulation material disposed in a space between the both metal plates.

The environmental testing device disclosed in Japanese Patent Application Laid-Open No. 7-270303 does not have an electromagnetic shield effect. That is, a metal plate is used for both the heat insulation wall constituting the chamber body and the heat insulation wall constituting the door, but the electromagnetic shield effect is not obtained just because the metal plate is used. Therefore, the test piece is sometimes affected by an electromagnetic wave from the outside, or the electromagnetic wave emitted from the test piece sometimes leaks to the outside.

SUMMARY OF THE INVENTION

An object of the present invention is to enhance an electromagnetic shield effect in an environmental testing device.

An environmental testing device according to an aspect of the present invention includes: a heat insulation chamber that includes a test chamber and is formed using a heat insulation panel that is electrically conductible; an air conditioner; and a blower for generating an air flow that causes air conditioned by the air conditioner to flow into the test chamber. The heat insulation chamber includes a chamber body that has an entrance, and a door that opens and closes the entrance. A heat insulation panel forming the chamber body includes an outer panel and an inner panel disposed inside the outer panel. The environmental testing device further includes a radiation-absorbent material disposed between the outer panel and the inner panel. The heat insulation panel forming the chamber body and a heat insulation panel forming the door are connected to each other in an electrically conductible manner.

An environmental testing device according to another aspect of the present invention includes: a heat insulation chamber that includes a test chamber and is formed using a heat insulation panel that is electrically conductible; an air conditioner; and a blower for generating an air flow that causes air conditioned by the air conditioner to flow into the test chamber. The heat insulation chamber includes a chamber body that has an entrance, and a door that opens and closes the entrance. A heat insulation panel forming the chamber body includes an outer panel and an inner panel disposed inside the outer panel. The heat insulation panel forming the chamber body and a heat insulation panel forming the door are connected to each other in an electrically conductible manner. The heat insulation panel forming the chamber body is provided with an opening through which a shaft of the blower is inserted. The environmental testing device further includes a shield box that is attached to the heat insulation panel provided with the opening so as to cover the opening and is electrically conductible with the heat insulation panel.

An environmental testing device according to another aspect of the present invention includes: a heat insulation chamber that includes a test chamber and is formed using a heat insulation panel that is electrically conductible; an air conditioner for performing air conditioning and including an evaporator for exchanging heat between a refrigerant and air to evaporate the refrigerant; and a blower for generating an air flow that causes air conditioned by the air conditioner to flow into the test chamber. The heat insulation chamber includes a chamber body that has an entrance, and a door that opens and closes the entrance. A heat insulation panel forming the chamber body includes an outer panel and an inner panel disposed inside the outer panel. The heat insulation panel forming the chamber body and a heat insulation panel forming the door are connected to each other in an electrically conductible manner. The heat insulation panel forming the chamber body is provided with an opening through which a pipe leading to the evaporator is drawn out from the heat insulation chamber. The environmental testing device further includes a shield box that is attached to the heat insulation panel provided with the opening so as to cover the opening and at least a part of the pipe and is electrically conductible with the heat insulation panel.

BRIEF DESCRIPTION OF THE DRAWINGS

FIG. 13 is a view schematically illustrating an environmental testing device according to another embodiment.

DESCRIPTION OF EMBODIMENTS

Figure 1:
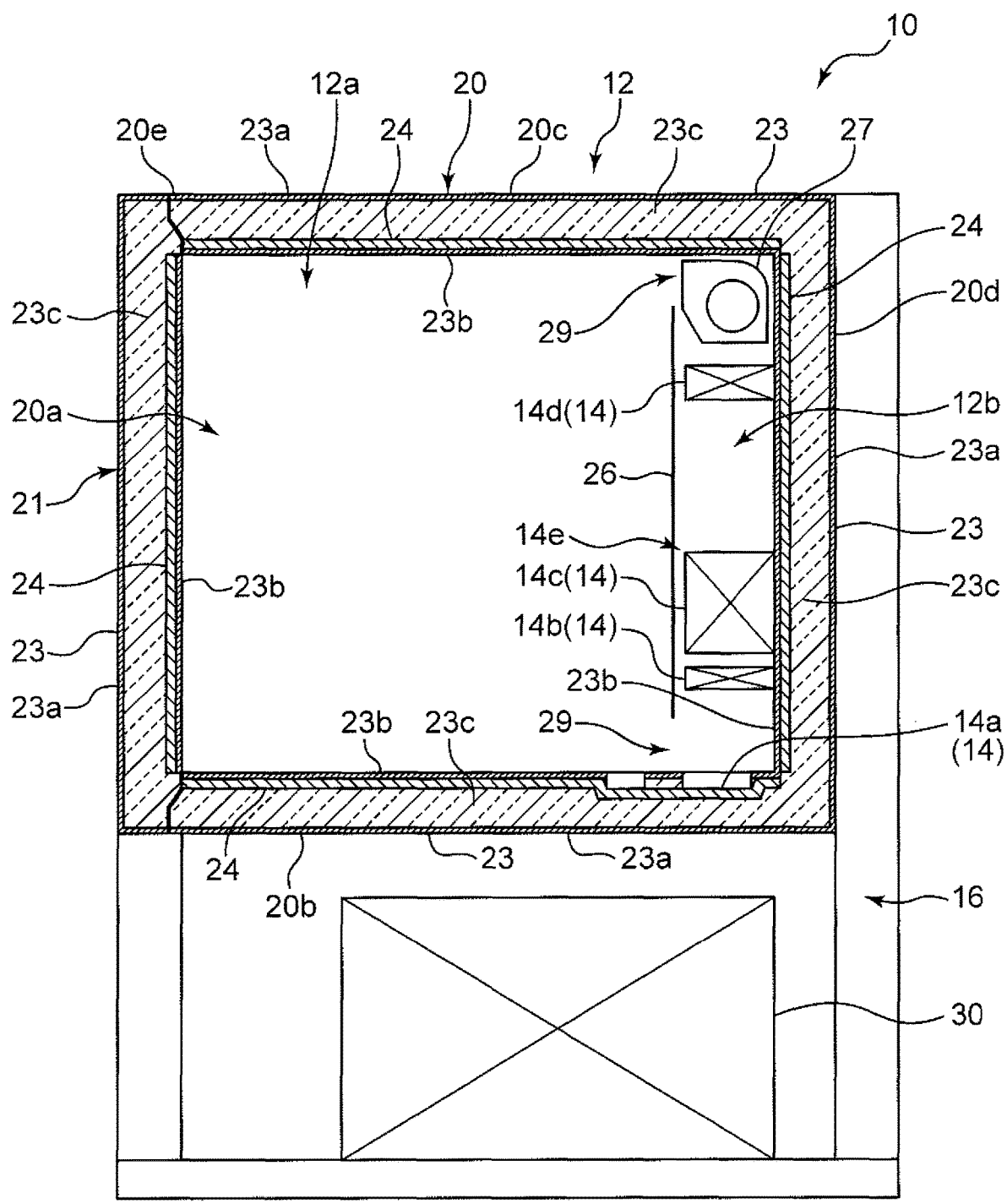
FIG. 1 is a view schematically illustrating an environmental testing device according to a first embodiment.

Embodiments for carrying out the present invention will be described below in detail with reference to the drawings.

First Embodiment

An environmental testing device 10 according to the first embodiment includes a heat insulation chamber 12 including a test chamber 12a and an air conditioning chamber 12b, and a machine chamber 16 provided with equipment connected to an air conditioner 14 for air-conditioning the inside of the test chamber 12a. The environmental testing device 10 performs control in which the temperature and humidity of air in the test chamber 12a are maintained at set values for a set time. This makes it possible to apply a predetermined heat load to a test piece disposed in the test chamber 12a. The environmental testing device 10 is not limited to the case of being configured as a temperature humidity chamber in which the temperature and humidity are adjusted, and may be configured as a temperature chamber in which only the temperature is adjusted, for example. The environmental testing device 10 may be configured to be able to perform a thermal shock test.

In the environmental testing device 10 according to the first embodiment, the heat insulation chamber 12 is configured to suppress transmission of the electromagnetic wave. Therefore, even when the test piece generates an electromagnetic wave, leakage of the electromagnetic wave to the outside of the heat insulation chamber 12 is suppressed. Alternatively, the external electromagnetic wave is prevented from affecting the test piece in the heat insulation chamber 12.

The heat insulation chamber 12 includes a chamber body 20 having an entrance 20a, and a door 21 that opens and closes the entrance 20a. The entrance 20a may have a size that allows a person to enter and exit or may be smaller than that size, and in this case, it is only required to have a size that can be used for taking in and out the test piece. The entrance 20a is formed at a front end of the chamber body 20. The "front end" mentioned here means an end part on the entrance 20a side of the chamber body 20. It becomes the end part on the front surface side when the entrance 20a is formed on the front surface, and is an end part on the side surface side when the entrance 20a is formed on the side surface.

The chamber body 20 includes a bottom surface part 20b, a top surface part 20c disposed above the bottom surface part 20b, and a side wall part 20d that closes the three sides other than the entrance 20a, and the chamber body 20 is formed in a hexahedral shape in which the entrance 20a is opened. The entrance 20a is positioned on the front surface of the heat insulation chamber 12, for example, and the side wall part 20d constitutes the left side surface, the back surface, and the right side surface of the heat insulation chamber 12. The entrance 20a is not limited to the configuration positioned on the front surface, and may be positioned on the side surface.

The chamber body 20 is formed using a heat insulation panel 23 made of an electrically conductible material, and the door 21 is also formed using the heat insulation panel 23 made of an electrically conductible material. The heat insulation panel 23 of the chamber body 20 includes the heat insulation panel 23 constituting the bottom surface part 20b, the heat insulation panel 23 constituting the top surface part 20c, the heat insulation panel 23 constituting the side wall part 20d on the back surface, the heat insulation panel 23 constituting the side wall part 20d on the left side surface, and the heat insulation panel 23 constituting the side wall part 20d on the right side surface.

Figure 2:
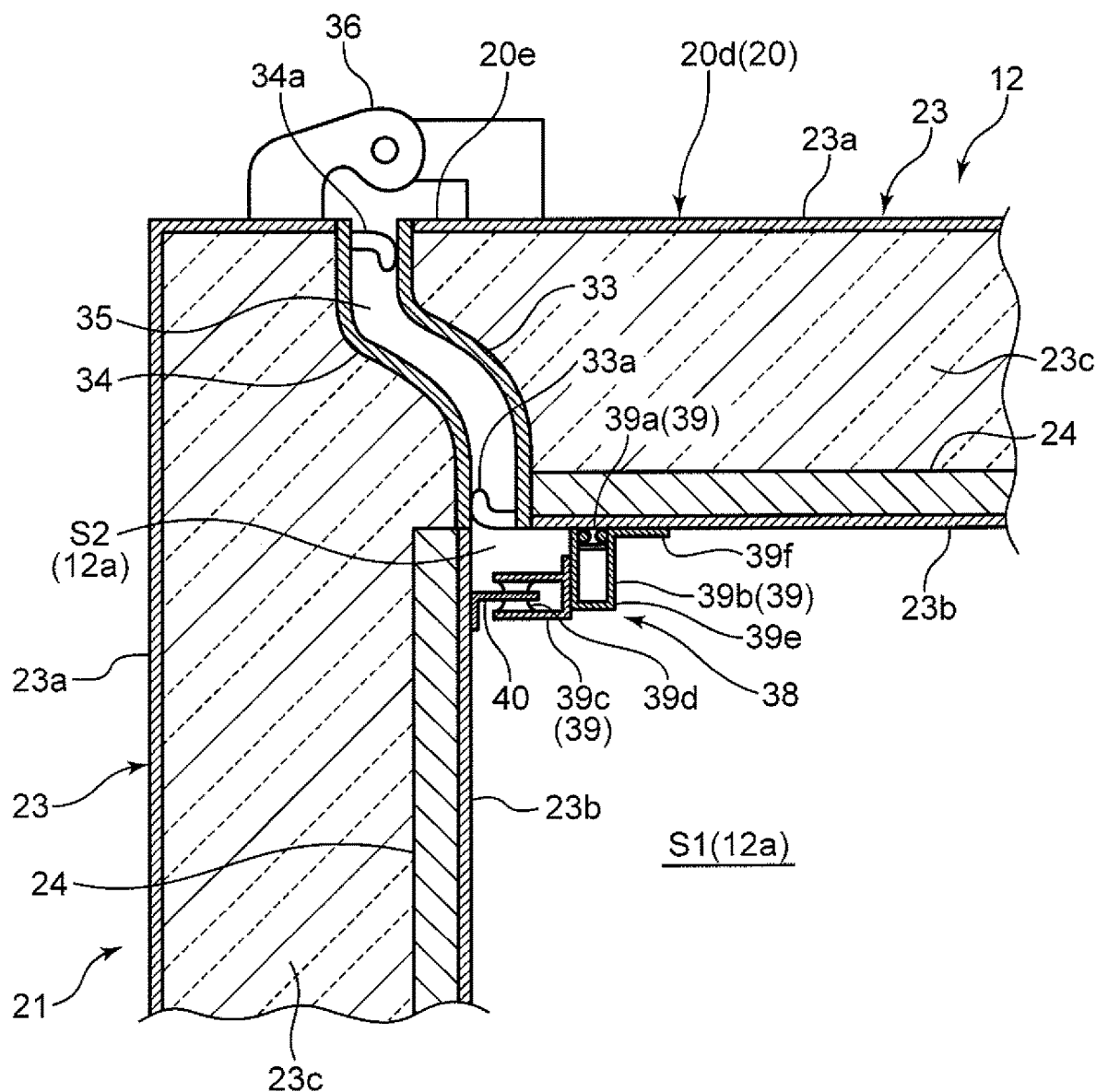
FIG. 2 is an enlarged view of the vicinity of hinges of a chamber body and a door in a heat insulation chamber of the environmental testing device.

As also illustrated in FIG. 2, the heat insulation panel 23 includes an outer panel 23a exposed to the outside, an inner panel 23b disposed inside the outer panel 23a and facing the inner side of the heat insulation chamber 12, and a heat insulation material 23c disposed between the outer panel 23a and the inner panel 23b. Both the outer panel 23a and the inner panel 23b are made of an electrically conductible metal plate, and the outer panel 23a and the inner panel 23b are grounded. The heat insulation material 23c is made of glass wool or urethane resin foam. A Faraday cage is formed by the outer panel 23a and the inner panel 23b being made of an electrically conductive metal plate, but the Faraday cage can be formed as long as at least one of the outer panel 23a and the inner panel 23b is made of an electrically conductive metal plate. The outer panel 23a and the inner panel 23b need not be grounded.

A radiation-absorbent material 24 is disposed in addition to the heat insulation material 23c between the outer panel 23a and the inner panel 23b. The radiation-absorbent material 24 is a mixture of carbon powder and foamed material of urethane resin, for example, and is configured to absorb radio waves by dielectric loss (dielectric radiation-absorbent material). That is, the radiation-absorbent material 24 has electrical conductivity. The heat insulation material 23c does not function as the radiation-absorbent material 24. Since the radiation-absorbent material 24 is disposed in the space between the outer panel 23a and the inner panel 23b, it is not affected by the humidity of the air in the test chamber 12a. Therefore, even if a high humidity test is performed, deterioration of the radiation-absorbent material 24 hardly occurs.

The radiation-absorbent material 24 is not limited to a dielectric radiation-absorbent material, and may be, for example, a conductive radiation-absorbent material made of conductive fiber and absorbing radio waves by resistance inside the material, or a magnetic radiation-absorbent material that absorbs radio waves by magnetic loss of a ferrite core or the like.

The radiation-absorbent material 24 is formed in a flat plate shape and is disposed along the inner panel 23b. That is, the radiation-absorbent material 24 is disposed close to the inner panel 23b relative to the heat insulation material 23c. Therefore, in a case of a configuration where the test piece emits radio waves, the radio waves can be absorbed at a position closer to the test piece. However, the radiation-absorbent material 24 is not limited to be disposed along the inner panel 23b, and instead of this, may be disposed along the outer panel 23a, or may be disposed at a position sandwiched between the heat insulation material 23c and the heat insulation material 23c.

The radiation-absorbent material 24 is provided on the heat insulation panel 23 constituting the top surface part 20c of the heat insulation chamber 12, the heat insulation panel 23 constituting the bottom surface part 20b, the heat insulation panel 23 constituting the side wall part 20d, and the heat insulation panel 23 constituting the door 21. That is, the radiation-absorbent material 24 is disposed on each surface of the heat insulation chamber 12 having a hexahedron shape. Although the radiation-absorbent material 24 is disposed over the entire top surface part 20c, the radiation-absorbent material 24 is only required to be disposed over at least a half or more of the top surface part 20c. If the radiation-absorbent material 24 is disposed in a range of at least half or more of the top surface part 20c, radio waves repeatedly reflected between the inner panel 23b and the outer panel 23a can be absorbed and gradually attenuated. The same is true for the bottom surface part 20b, the side wall part 20d, and the door 21. The radiation-absorbent material 24 only needs to be disposed in any of the top surface part 20c, the bottom surface part 20b, and the side wall part 20d, and does not need to be disposed in all of them. In the door 21, the radiation-absorbent material 24 can be omitted.

As illustrated in FIG. 1, a partition plate 26 is disposed in the heat insulation chamber 12, and this partition plate 26 defines the space in the heat insulation chamber 12 into the test chamber 12a and the air conditioning chamber 12b. The test chamber 12a is a chamber for arranging the test piece.

The air conditioning chamber 12b is a chamber for disposing the air conditioner 14 and a blower 27, and is connected to the test chamber 12a through a plurality of communication holes 29. The air conditioner 14 disposed in the air conditioning chamber 12b includes a humidifier 14a for humidifying the air, a dehumidifier 14b for dehumidifying the air, a cooler 14c for cooling the air, and a heater 14d for heating the air. The blower 27 may be disposed not in the air conditioning chamber 12b but in the test chamber 12a or may be disposed in the communication hole 29.

The humidifier 14a is provided on the bottom surface part 20b in the air conditioning chamber 12b, and is formed in a dish shape so as to store water. A heater (not illustrated) is disposed in the humidifier 14a. The dehumidifier 14b and the cooler 14c are configured by a heat exchanger (evaporator 14e) provided in a refrigerator having a vapor compression type refrigerant circuit. The heater 14d is configured by, for example, a heating wire type heater. When the environmental testing device 10 is configured as a temperature chamber, the humidifier 14a and the dehumidifier 14b are omitted.

The blower 27 is configured to generate an air flow that causes air conditioned by the air conditioner 14 to flow into the test chamber 12a. That is, the blower 27 is disposed downstream the air conditioner 14 in the flow direction of the air, and is configured to blow out the air toward the test chamber 12a through the communication hole 29. The air-conditioned air blown out of the blower 27 flows into the test chamber 12a through some of the communication holes 29. The air in the test chamber 12a flows into the air conditioning chamber 12b through the other communication holes 29.

The machine chamber 16 is formed from a position on the back surface side of the heat insulation chamber 12 to a position on the lower side of the heat insulation chamber 12. For example, a heat exchanger (condenser 30) of the refrigerator is disposed at the lower position of the heat insulation chamber 12. The condenser 30 is connected to the evaporator 14e in the air conditioning chamber 12b through a refrigerant pipe (not illustrated) so that the refrigerant can flow.

As illustrated in FIG. 2, a resin part (first resin part 33) is formed at a front end 20e of the chamber body 20 (end part on the door 21 side), and a resin part (second resin part 34) is also formed at a peripheral edge part of the door 21. In a state where the door 21 is at the closed position, a gap 35 is formed between the first resin part 33 and the second resin part 34. Accordingly, heat transfer between the heat insulation panel 23 constituting the chamber body 20 and the heat insulation panel 23 constituting the door 21 is suppressed. However, since the Faraday cage is formed by providing the conductive connection part 38 described later, an electromagnetic shield effect can be obtained even if the gap 35 is formed between the chamber body 20 and the door 21. FIG. 2 illustrates the vicinity of a hinge 36 that rotatably supports the door 21, but other sites of the door 21 have the same configuration over the entire circumference of the door 21. For example, the gap 35 is also formed between the first resin part 33 and the second resin part 34 at a tip end of the door 21 on the opposite side to the hinge 36.

The first resin part 33 is provided with a first packing 33a that extends toward the second resin part 34 and comes into contact with the second resin part 34, and the second resin part 34 is provided with a second packing 34a that extends toward the first resin part 33 and comes into contact with the first resin part 33. This prevents air in the test chamber 12a from leaking out of the test chamber 12a through the gap 35.

The environmental testing device 10 includes a conductive connection part 38 that connects, in an electrically conductible manner, the heat insulation panel 23 forming the chamber body 20 and the heat insulation panel 23 forming the door 21 to each other when the door 21 is at a position (closed position) where the entrance 20a is closed. By providing the conductive connection part 38, the heat insulation chamber 12 in which the door 21 is in the closed position is formed as a Faraday cage, and this gives the electromagnetic wave shielding structure of the heat insulation chamber 12.

The conductive connection part 38 is provided at a position in the test chamber 12a where the chamber body 20 and the door 21 are adjacent to each other. The conductive connection part 38 includes a frame member 39 disposed so as to be in contact with the heat insulation panel 23 forming the chamber body 20, and a contact member 40 disposed so as to be in contact with the heat insulation panel 23 forming the door 21. The frame member 39 is attached to the front end 20e of the chamber body 20 so as to be positioned in the test chamber 12a. The contact member 40 is attached to the peripheral edge part of the door 21 so as to be positioned in the test chamber 12a.

Both the frame member 39 and the contact member 40 have conductivity, and the contact member 40 comes into contact with the frame member 39 when the door 21 is at a position (closed position) where the entrance 20a is closed. Therefore, when the door 21 is in the closed position, a closed circuit of the conductor is formed by the chamber body 20, the door 21, and the conductive connection part 38.

Figure 3:
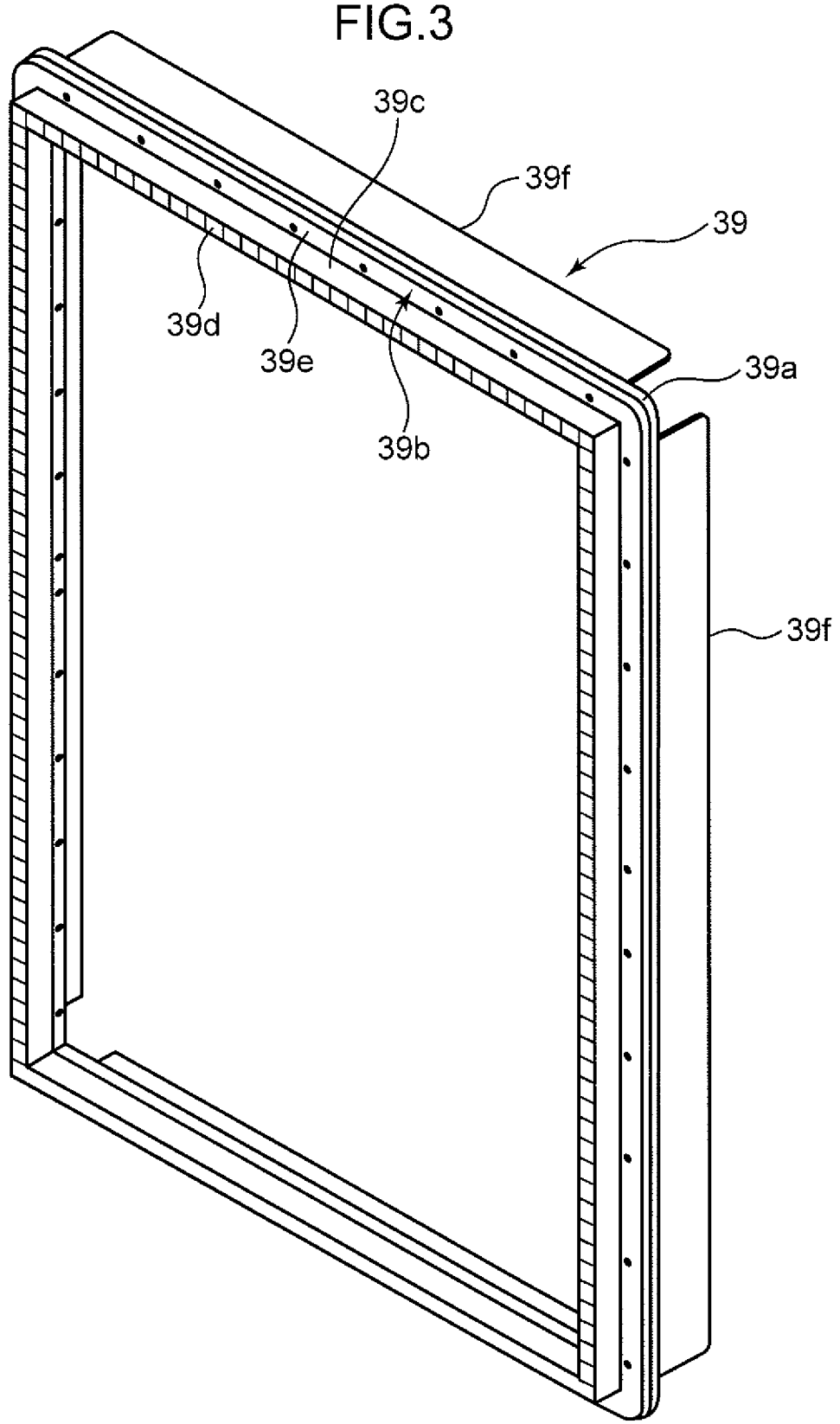
FIG. 3 is a perspective view of a frame member constituting a conductive connection part provided in the heat insulation chamber.

As also illustrated in FIG. 3, the frame member 39 includes a shield gasket 39a, a body part 39b that has a frame shape and presses the shield gasket 39a against the heat insulation panel 23 forming the chamber body 20, and a connection part 39c that is fixed to the body part 39b and is capable of being brought into contact with the contact member 40.

The shield gasket 39a is formed of a flexible and conductive metal member (metal mesh), and is disposed so as to extend along the peripheral edge of the entrance 20a. Since the shield gasket 39a is pressed against the inner panel 23b of the heat insulation panel 23 forming the chamber body 20 by the body part 39b, conductivity between the body part 39b and the heat insulation panel 23 forming the chamber body 20 is secured. The shield gasket 39a may not be formed of a metal member, but may be formed of a rubber-based packing (for example, a configuration in which conductive particles are dispersed in silicon rubber) having conductivity.

The body part 39b includes a fix part 39f fixed to the heat insulation panel 23, and a holding part 39e that holds the shield gasket 39a while being held by the fix part 39f. The holding part 39e is formed in a frame shape by bending a sheet metal into a hollow shape and combining four members extending in one direction. That is, the holding part 39e is formed in a frame shape such that a hollow member extends along the peripheral edge of the entrance 20a. The body part 39b is disposed so as to extend along the peripheral edge of the entrance 20a. The fix part 39f is provided on an outer peripheral part of the holding part 39e, and is fixed to the inner panel 23b of the heat insulation panel 23 constituting the chamber body 20. The shield gasket 39a is sandwiched between the body part 39h and the inner panel 23b in a state where the fix part 39f is fixed to the inner panel 23b. When fixing the fix part 39f to the inner panel 23b, fastening with a screw, fixing by welding, or other fixing methods can be adopted. The fix part 39f is fastened to the heat insulation panel 23, thereby pressing the shield gasket 39a held by the holding part 39e against the inner panel 23b.

The connection part 39c is a site protruding from the body part 39b toward the door 21, and a shield finger 39d is attached to the connection part 39c. The shield finger 39d is configured such that the contact member 40 on the door 21 side is fitted onto when the door 21 moves to the closed position.

The contact member 40 is disposed in a frame shape along the peripheral edge part of the door 21, and is fixed to the door 21 so as to be in contact with the inner panel 23b of the heat insulation panel 23.

In a state where the contact member 40 is in contact with the connection part 39c of the frame member 39, the space in the test chamber 12a is divided into a main space S1 and an adjacent space S2. The adjacent space S2 is a space adjacent to the gap 35 between the chamber body 20 and the door 21, and the main space S1 is a space positioned on a side opposite to the adjacent space S2 with respect to the conductive connection part 38. That is, the conductive connection part 38 forms, in the test chamber 12a, the adjacent space S2, which is a space adjacent to the gap 35 between the chamber body 20 and the door 21, in a state where the contact member 40 is in contact with the connection part 39c. The adjacent space S2 is isolated from the main space S1. Therefore, an air layer is formed between the conductive connection part 38 and the gap 35 between the chamber body 20 and the door 21, and heat transfer from the inside of the main space S1 to the gap 35 can be suppressed.

As described above, the present embodiment is provided with the conductive connection part 38 that connects, in an electrically conductible manner, the heat insulation panel 23 forming the chamber body 20 and the heat insulation panel 23 forming the door 21 to each other. Therefore, since the heat insulation chamber 12 becomes electrically conductible as a whole, the electromagnetic shield effect can be obtained. Moreover, since the radiation-absorbent material 24 is disposed between the outer panel 23a and the inner panel 23b of the heat insulation panel 23, radio waves repeatedly reflected between the outer panel 23a and the inner panel 23b are absorbed by the radiation-absorbent material 24. Accordingly, the radio waves can be attenuated in the heat insulation panel 23. Therefore, it is possible to enhance the electromagnetic shield effect in the environmental testing device 10. Since the radiation-absorbent material 24 is disposed between the outer panel 23a and the inner panel 23b, it is not affected by the state (temperature and humidity) of air in the test chamber 12a. Therefore, even when a high temperature test or a high humidity test is performed, it is possible to suppress deterioration of the radiation-absorbent material 24.

In the present embodiment, the body part 39b that has a frame shape of the frame member 39 of the conductive connection part 38 presses the shield gasket 39a against the heat insulation panel 23 forming the chamber body 20. This secures electrical conduction between the frame member 39 and the heat insulation panel 23 of the chamber body 20. The contact member 40 in contact with the heat insulation panel 23 of the door 21 comes into contact with the connection part 39c of the frame member 39. Accordingly, the frame member 39 becomes electrically conductible with the heat insulation panel 23 constituting the door 21 via the contact member 40.

The adjacent space S2 adjacent to the gap 35 between the chamber body 20 and the door 21 is isolated from the main space S1 other than the adjacent space S2 in the test chamber 12a by the conductive connection part 38. This suppresses heat transfer from the gap 35 between the chamber body 20 and the door 21 to the main space S1. Therefore, the conductive connection part 38 can contribute not only to securing of electrical conduction between the chamber body 20 and the door 21 but also to suppression of heat transfer from the main space S1 to the gap 35 between the chamber body 20 and the door 21.

The radiation-absorbent material 24 is disposed in the heat insulation panel 23, and the conductive connection part 38 that connects, in a conductible manner, the heat insulation panel 23 constituting the chamber body 20 and the heat insulation panel 23 constituting the door 21 is disposed in the test chamber 12a. This makes it possible to achieve the electromagnetic shield effect only by adding the radiation-absorbent material 24 and the conductive connection part 38 without performing large processing on a conventional environmental testing device.

Figure 4A:
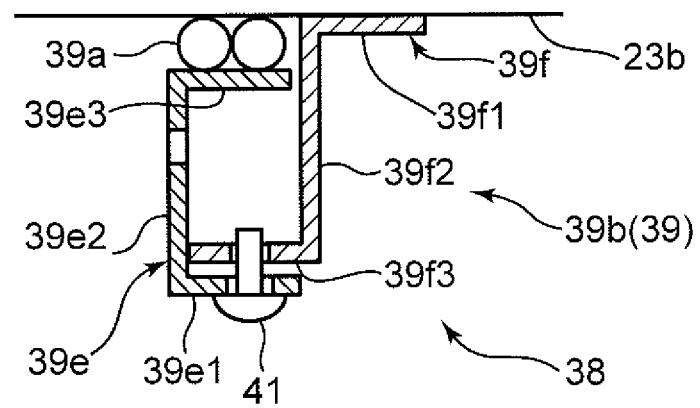
FIG. 4A is a view illustrating a conductive connection part according to a modification, and illustrates a state before a holding part is displaced.
Figure 4B:
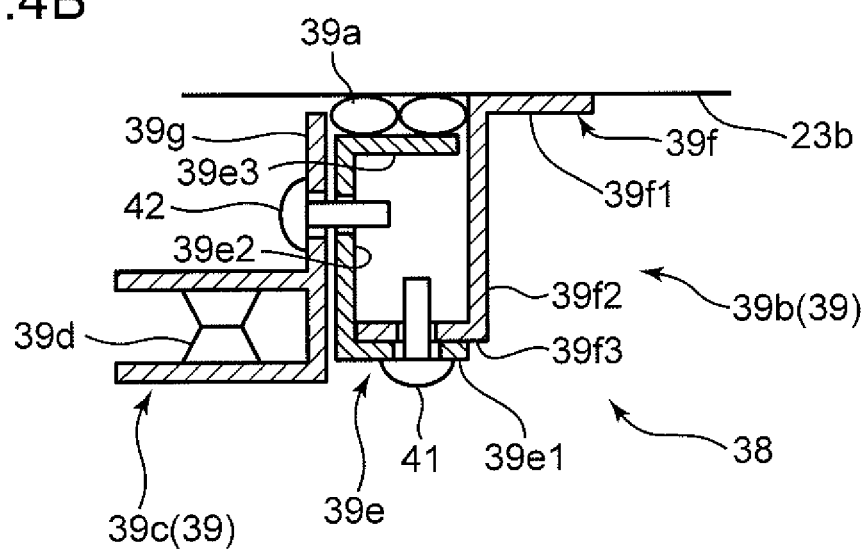
FIG. 4B is a view illustrating the conductive connection part according to the modification, and illustrates a state after the holding part is displaced.

The configuration of the frame member 39 of the conductive connection part 38 is not limited to the configuration illustrated in FIG. 2. The holding part 39e of the frame member 39 may press the shield gasket 39a against the heat insulation panel 23 by being displaced with respect to the fix part 39f. Specifically, as illustrated in FIGS. 4A and 4B, the fix part 39f of the frame member 39 integrally includes an outer end part 39f1 disposed along the inner surface of the inner panel 23b, an extending part 39f2 overhanging from the outer end part 39f1 in a direction away from the inner panel 23b, and an inner end part 39f3 overhanging from the inner end of the extending part 39f2. The inner end part 39f3 protrudes from the extending part 39f2 in a direction intersecting the extending part 39f2. On the other hand, the holding part 39e integrally includes an inner end part 39e1 positioned inside (side away from the inner panel 23b) of the inner end part 39f3 of the fix part 39f, an extending part 39e2 overhanging from the inner end part 39e1 toward the inner panel 23b, and a pressing part 39e3 overhanging from the outer end of the extending part 39e2 in a direction along the inner panel 23b. The inner end part 39e1 of the holding part 39e is provided with an insertion hole through which a screw 41, which is a fastening member fastened to the inner end part 39f3 of the fix part 39f, is inserted. This screw 41 couples the holding part 39e to the fix part 39f. As the fastening member, a clamp or the like may be adopted instead of the screw 41.

The connection part 39c described above is fixed to the holding part 39e. The connection part 39c is integrally provided with a pressing part 39g that laterally presses the shield gasket 39a held by the holding part 39e. The pressing part 39g is provided with an insertion hole through which a screw 42 to be fastened to the extending part 39e2 of the holding part 39e is inserted. By the pressing part 39g being fixed to the holding part 39e of the body part 39b via the screw 42, the connection part 39c is also fixed to the holding part 39e. That is, the connection part 39c is fixed to the body part 39b via the pressing part 39g.

Figure 5:
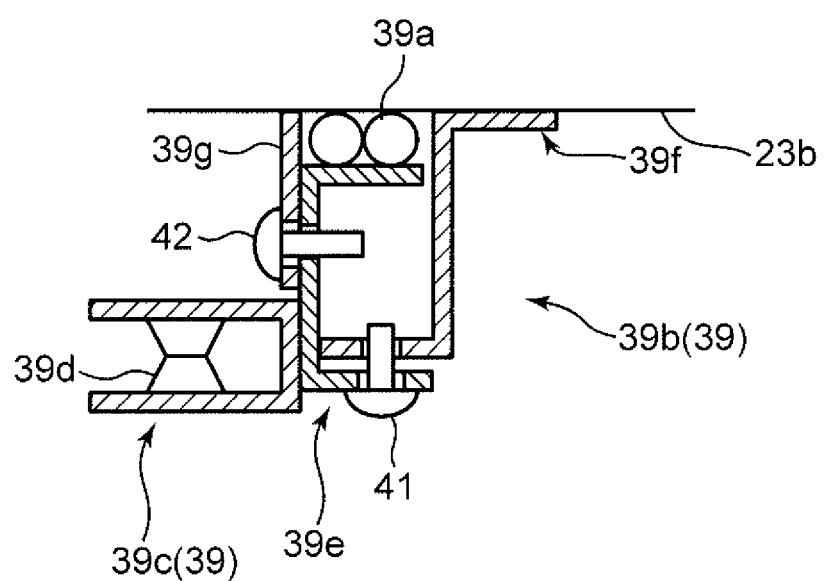
FIG. 5 is a view illustrating a further modification of the conductive connection part.

FIG. 4B illustrates an example in which the pressing part 39g is integrally formed with the connection part 39c, but alternatively, as illustrated in FIG. 5, the pressing part 39g may be configured separately from the connection part 39c. In this case, the pressing part 39g can be displaced with respect to the holding part 39e by fastening of the screw 42, which is a fastening member. As the fastening member, a clamp or the like may be adopted instead of the screw 42. On the other hand, the connection part 39c is fixed to the holding part 39e with a screw (not illustrated) or by another method. It is also possible to omit the pressing part 39g.

In the state illustrated in FIG. 4A, the inner end part 39e1 of the holding part 39e and the inner end part 39f3 of the fix part 39f are separated from each other, and in this state, the pressing part 39e3 of the holding part 39e has not yet pressed the shield gasket 39a. That is, the shield gasket 39a is not yet completely fixed, and is merely temporarily fixed so as not to fall off from the holding part 39e. Then, when the screw 41 is fastened from this state, as illustrated in FIG. 4B, the holding part 39e is displaced in a direction where the inner end part 39e1 of the holding part 39e approaches the inner end part 39f3 of the fix part 39f. Along with this, the pressing part 39e3 of the holding part 39e approaches the inner panel 23b, whereby the shield gasket 39a is pressed against the inner panel 23b by the holding part 39e and is deformed. When the screw 42 is fastened, the pressing part 39g laterally presses the shield gasket 39a protruding from the holding part 39e by being pressed with the pressing part 39e3 of the holding part 39e. As described above, since the shield gasket 39a is pressed in two steps, the close contact with the heat insulation panel 23 can be strengthened.

In a case where the chamber body 20 and the door 21 can be electrically conducted directly to each other, the conductive connection part 38 can be omitted.

Second Embodiment

Figure 6:
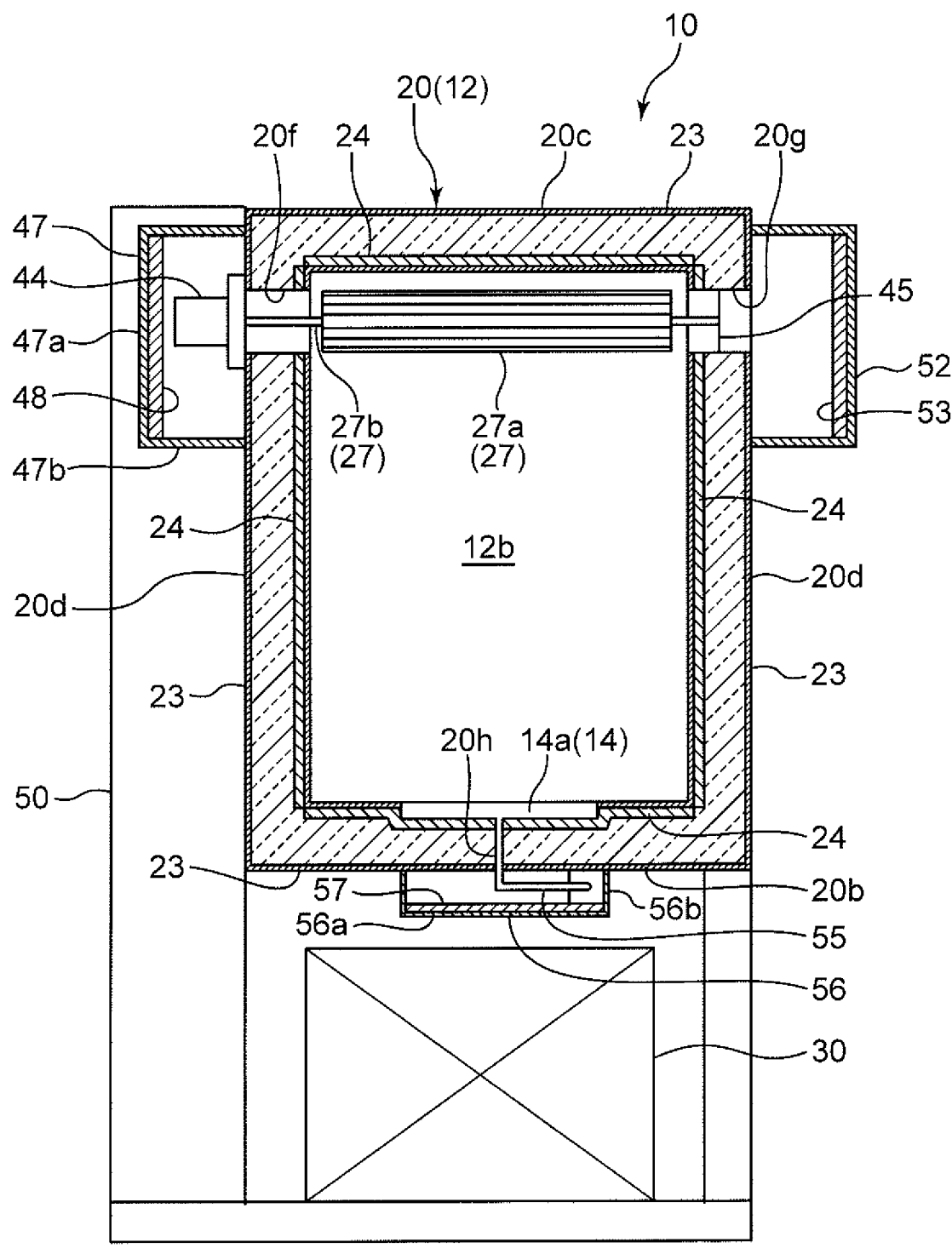
FIG. 6 is a view schematically illustrating an environmental testing device according to a second embodiment.

FIG. 6 illustrates the second embodiment of the present invention. Here, the same components as those in the first embodiment are given the same reference numerals, and a detailed description thereof will be omitted.

In the second embodiment, the heat insulation panel 23 forming the chamber body 20 is provided with an opening through which a shaft 27b of the blower 27 is inserted, and provided with shield boxes 47 and 52 so as to cover this opening.

Specifically, the blower 27 is configured by a cross flow fan, and the blower 27 includes an impeller 27a and the shaft 27b that supports the impeller 27a. The shaft 27b extends from both ends of the impeller 27a. FIG. 6 does not illustrate the air conditioner 14 (other than the humidifier 14a) disposed in the air conditioning chamber 12b.

One end part of the shaft 27b is inserted into an opening (motor side opening 20f) formed in the side wall part 20d constituting the left side surface (or the right side surface) in the chamber body 20. One end part of this shaft 27b is attached with a motor 44 for driving the blower 27. The motor side opening 20f penetrates the heat insulation panel 23.

The other end part of the shaft 27b is inserted into an opening (bearing side opening 20g) formed in the side wall part 20d constituting the right side surface (or the left side surface) in the chamber body 20. The other end of the shaft 27b is provided with a bearing 45 that rotatably supports the shaft 27b. The bearing side opening 20g penetrates the heat insulation panel 23.

Figure 7A:
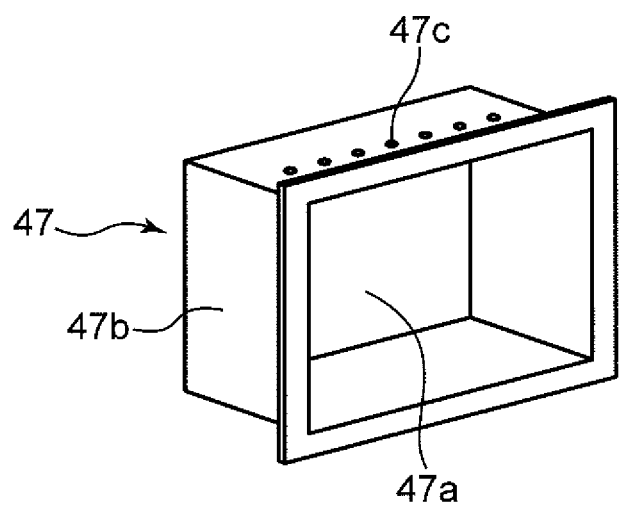
FIG. 7A is a perspective view of a motor side shield box provided in the environmental testing device.

The motor side opening 20f is covered with the shield box 47. As illustrated in FIG. 7A, the shield box 47 has a bottom surface part 47a and a peripheral surface part 47b extending along the peripheral edge of the bottom surface part 47a, and is opened in one direction. The shield box 47 is attached to the heat insulation panel 23 in which the motor side opening 20f is formed such that the opened side faces the motor side opening 20f (heat insulation panel 23). That is, the shield box 47 is disposed such that the bottom surface part 47a opposes the heat insulation panel 23.

The shield box 47 is made of a conductive member such as metal, and can be electrically conducted to the outer panel 23a of the heat insulation panel 23. Therefore, even if the motor side opening 20f is formed in the heat insulation panel 23, electromagnetic waves are prevented from leaking out through this motor side opening 20f, and the electromagnetic waves are prevented from entering the heat insulation chamber 12. Moreover, it is only necessary to attach the shield box 47 to the heat insulation panel 23.

Figure 7B:
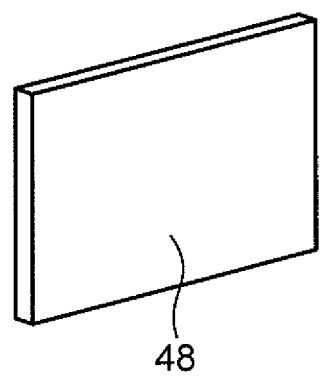
FIG. 7B is a perspective view of a radiation-absorbent material disposed in the shield box.

A radiation-absorbent material 48 is disposed in the shield box 47. The radiation-absorbent material 48 has a flat plate shape as illustrated in FIG. 7B, and is disposed along the bottom surface part 47a of the shield box 47. The radiation-absorbent material 48 absorbs and attenuates radio waves repeatedly reflected between the outer panel 23a of the heat insulation panel 23 and the bottom surface part 47a of the shield box 47.

The shield box 47 is provided with an opening 47c for cooling. This opening 47c has a size so extremely small that does not reduce the shielding effect.

As illustrated in FIG. 6, the shield box 47 covering the motor side opening 20f and the motor 44 is accommodated in a control box 50 disposed on the side of the heat insulation chamber 12. Therefore, this shield box 47 cannot be recognized from the outside. The control box 50 is provided with an operation unit (not illustrated) on the front surface and accommodates control equipment (not illustrated).

The bearing side opening 20g is covered with a shield box 52. The shield box 52 is formed in the same shape as that of the shield box 47 covering the motor side opening 20f. The shield box 52 is attached to the heat insulation panel 23 in which the bearing side opening 20g is formed such that the opened side faces the bearing side opening 20g (heat insulation panel 23). Similarly to the shield box 47, the shield box 52 may also be formed with a cooling opening (not illustrated).

A radiation-absorbent material 53 is disposed in the shield box 52 covering the bearing side opening 20g. This radiation-absorbent material 53 has the same configuration as that of the radiation-absorbent material 48 disposed in the shield box 47 on the motor 44 side.

A water supply pipe 55 is connected to the humidifier 14a, and this water supply pipe 55 is inserted through an opening (bottom surface opening 20h) formed in the heat insulation panel 23 forming the bottom surface part 20b in the chamber body 20. The bottom surface opening 20h penetrates the heat insulation panel 23.

Figure 8B:
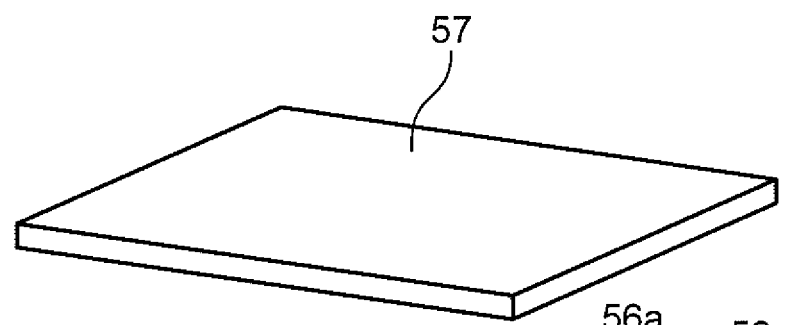
FIG. 8B is a perspective view of a radiation-absorbent material disposed in the shield box.
Figure 8A:
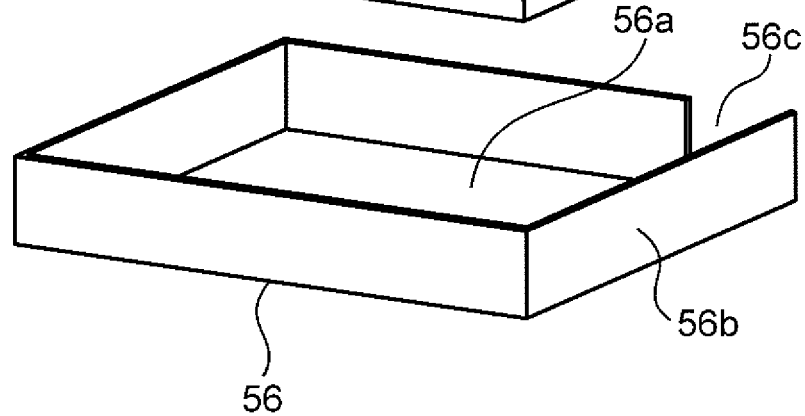
FIG. 8A is a perspective view of a shield box on a bottom surface part side provided in the environmental testing device.

The bottom surface opening 20h is covered with a shield box 56. As illustrated in FIG. 8A, the shield box 56 has a bottom surface part 56a and a peripheral surface part 56b connected to the peripheral edge of the bottom surface part 56a, and is opened in one direction. The shield box 56 is attached to the heat insulation panel 23 in which the bottom surface opening 20h is formed such that the opened side faces the bottom surface part 20b of the heat insulation chamber 12. That is, the shield box 56 is disposed such that the bottom surface part 56a opposes the heat insulation panel 23.

The peripheral surface part 56b is provided with a cutout 56c for passing the water supply pipe 55. The humidifier 14a may be connected with a drain pipe (not illustrated) together with the water supply pipe 55 or instead of the water supply pipe 55, and the shield box 56 may cover the drain pipe.

A radiation-absorbent material 57 is disposed in the shield box 56. The radiation-absorbent material 57 has a flat plate shape as illustrated in FIG. 8B, and is disposed along the bottom surface part 56a of the shield box 56. The radiation-absorbent material 57 absorbs and attenuates radio waves repeatedly reflected between the outer panel 23a of the heat insulation panel 23 and the bottom surface part 56a of the shield box 56.

The present embodiment is provided with the conductive connection part 38 that connects, in an electrically conductible mariner, the heat insulation panel 23 forming the chamber body 20 and the heat insulation panel 23 forming the door 21 to each other. Therefore, since the heat insulation chamber 12 becomes electrically conductible as a whole, the electromagnetic shield effect can be obtained. Moreover, the heat insulation panel 23 formed with the openings 20f and 20g through which the shaft 27b of the blower 27 is inserted is attached with the shield boxes 47 and 52 in an electrically conductible manner with the heat insulation panel 23 so as to cover the openings 20f and 20g. Therefore, it is possible not only to dispose the shaft 27b of the blower 27 so as to penetrate the heat insulation panel 23, but also to suppress electromagnetic waves from leaking through the openings 20f and 20g and electromagnetic waves from entering into the heat insulation chamber 12. Accordingly, it is possible to enhance the electromagnetic shield effect in the environmental testing device 10.

Moreover, since the radiation-absorbent materials 48 and 53 are disposed in the space defined by the shield boxes 47 and 52 and the outer panel 23a, radio waves repeatedly reflected between the shield boxes 47 and 52 and the outer panel 23a are absorbed by the radiation-absorbent materials 48 and 53. Therefore, radio waves can be attenuated in the space defined by the shield boxes 47 and 52 and the outer panel 23a.

By the bottom surface opening 20h being formed in the heat insulation panel 23 constituting the bottom surface part 20b of the heat insulation chamber 12, the water supply pipe 55 (or the drain pipe) can be disposed so as to pass through the heat insulation panel 23, and moreover the bottom surface opening 20h is covered with the shield box 56. Therefore, it is possible to suppress electromagnetic waves from leaking through the bottom surface opening 20h and electromagnetic waves from entering into the heat insulation chamber 12.

When the chamber body 20 and the door 21 can be electrically conducted directly to each other, the conductive connection part 38 can be omitted. While description of the other configurations, operations, and effects are omitted, the description of the first embodiment can be applied to the description of the second embodiment.

Third Embodiment

Figure 9:
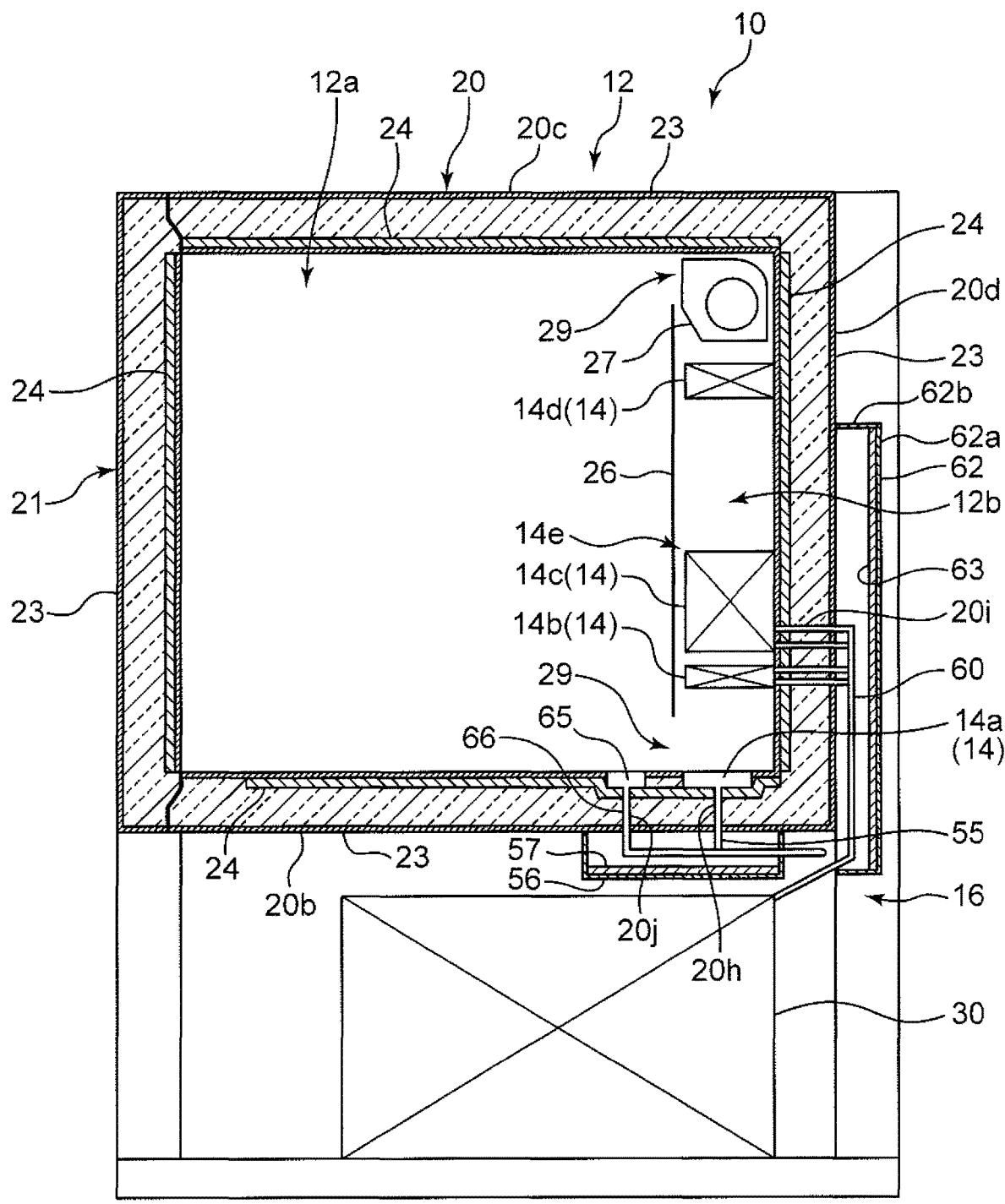
FIG. 9 is a view schematically illustrating an environmental testing device according to a third embodiment.

FIG. 9 illustrates the third embodiment of the present invention. Here, the same components as those in the first embodiment are given the same reference numerals, and a detailed description thereof will be omitted.

In the third embodiment, the heat insulation panel 23 forming the side wall part 20d on the back surface side is provided with an opening (pipe opening 20i) through which a refrigerant pipe 60 leading to the evaporator 14e is drawn out from the inside of the heat insulation chamber 12. The refrigerant pipe 60 extends downward at a site on the back surface side of the heat insulation chamber 12 in the machine chamber 16, and extends up to the condenser 30 disposed on the lower side of the heat insulation chamber 12.

The heat insulation panel 23 in which the pipe opening 20i is formed is attached with a shield box 62. The shield box 62 can be electrically conducted with the outer panel 23a of the heat insulation panel 23, and covers the pipe opening 20i and a part of the refrigerant pipe 60. Even if the pipe opening 20i is formed in the heat insulation panel 23, the shield box 62 prevents electromagnetic waves from leaking through the pipe opening 20i and electromagnetic waves from entering into the heat insulation chamber 12. Moreover, it is only necessary to attach the shield box 62 to the heat insulation panel 23. Since the shield box 62 is disposed in the machine chamber 16, it cannot be recognized from the outside.

Figure 10B:
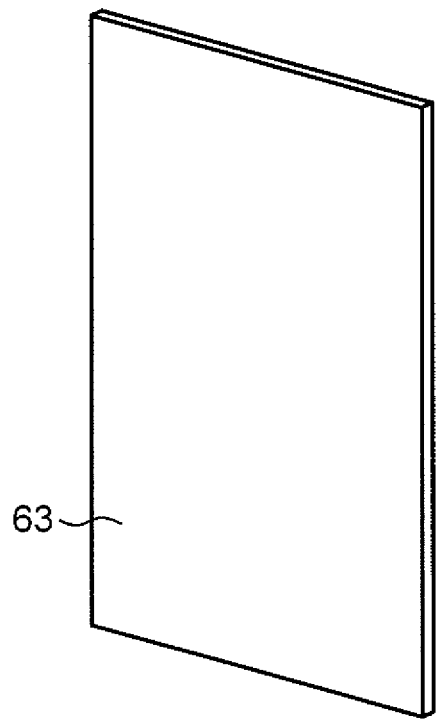
FIG. 10B is a perspective view of a radiation-absorbent material disposed in the shield box.
Figure 10A:
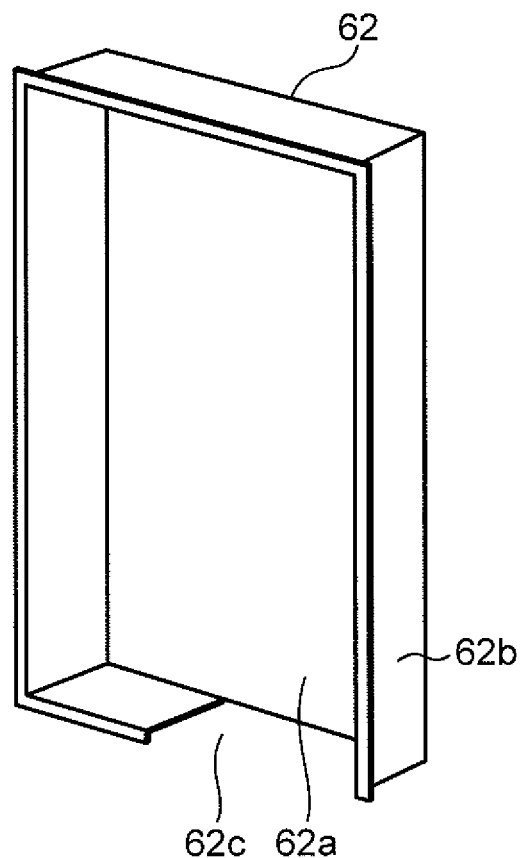
FIG. 10A is a perspective view of a shield box on a back surface side provided in the environmental testing device.

As illustrated in FIG. 10A, the shield box 62 has a bottom surface part 62a and a peripheral surface part 62b extending along the peripheral edge of the bottom surface part 62a, and is opened in one direction. The shield box 62 is attached to the heat insulation panel 23 in which the pipe opening 20i is formed such that the opened side faces the heat insulation chamber 12. That is, the shield box 62 is disposed such that the bottom surface part 62a opposes the heat insulation panel 23. The peripheral surface part 62b is provided with a cutout 62c for passing the refrigerant pipe 60.

A radiation-absorbent material 63 is disposed in the shield box 62. The radiation-absorbent material 63 has a flat plate shape as illustrated in FIG. 10B, and is disposed along the bottom surface part 62a of the shield box 62. The radiation-absorbent material 63 absorbs and attenuates radio waves repeatedly reflected between the outer panel 23a of the heat insulation panel 23 and the bottom surface part 62a of the shield box 62.

The bottom surface part 20b of the heat insulation chamber 12 is provided with a storage portion 65 for storing water overflowing from the humidifier 14a and dew condensation water generated in the air conditioning chamber 12b, and this storage portion 65 is connected with a discharge pipe 66 for discharging the dew condensation water to the outside. This discharge pipe 66 is either connected to a drain pipe connected to the humidifier 14a while the drain pipe being drawn out to the outside of the shield box 56 through the cutout 56c (FIG. 8A) of the shield box 56, or drawn out to the outside of the shield box 56 through the cutout 56c (FIG. 8A) of the shield box 56 together with the drain pipe. The bottom surface part 20b is provided with an opening (discharge pipe opening) 20j for drawing out the discharge pipe 66 from the storage portion 65.

The present embodiment is provided with the conductive connection part 38 that connects, in an electrically conductible manner, the heat insulation panel 23 forming the chamber body 20 and the heat insulation panel 23 forming the door 21 to each other. Therefore, since the heat insulation chamber 12 becomes electrically conductible as a whole, the electromagnetic shield effect can be obtained. Moreover, the heat insulation panel 23 formed with the pipe opening 20i for passing the refrigerant pipe 60 leading to the evaporator 14e is attached with the shield box 62 in an electrically conductible manner with the heat insulation panel 23 so as to cover the pipe opening 20i. Therefore, it is possible not only to dispose the refrigerant pipe 60 leading to the evaporator 14e so as to pass through the heat insulation panel 23, but also to suppress electromagnetic waves from leaking through the pipe opening 20i and electromagnetic waves from entering into the heat insulation chamber 12. Accordingly, it is possible to enhance the electromagnetic shield effect in the environmental testing device 10.

When the chamber body 20 and the door 21 can be electrically conducted directly to each other, the conductive connection part 38 can be omitted. While description of the other configurations, operations, and effects are omitted, the descriptions of the first embodiment and the second embodiment can be applied to the third embodiment.

Other Embodiments

Figure 11:
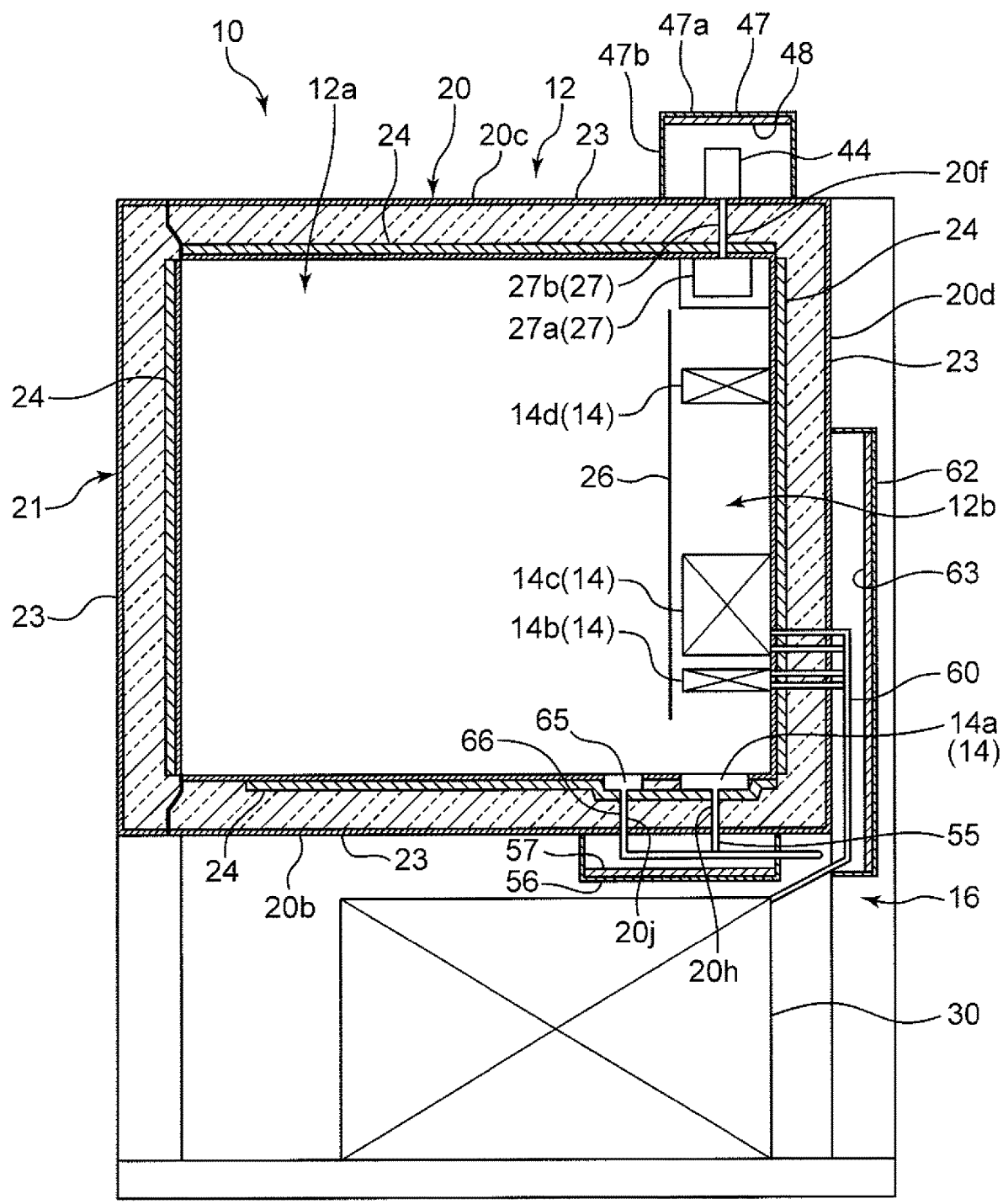
FIG. 11 is a view schematically illustrating an environmental testing device according to another embodiment.
Figure 12:
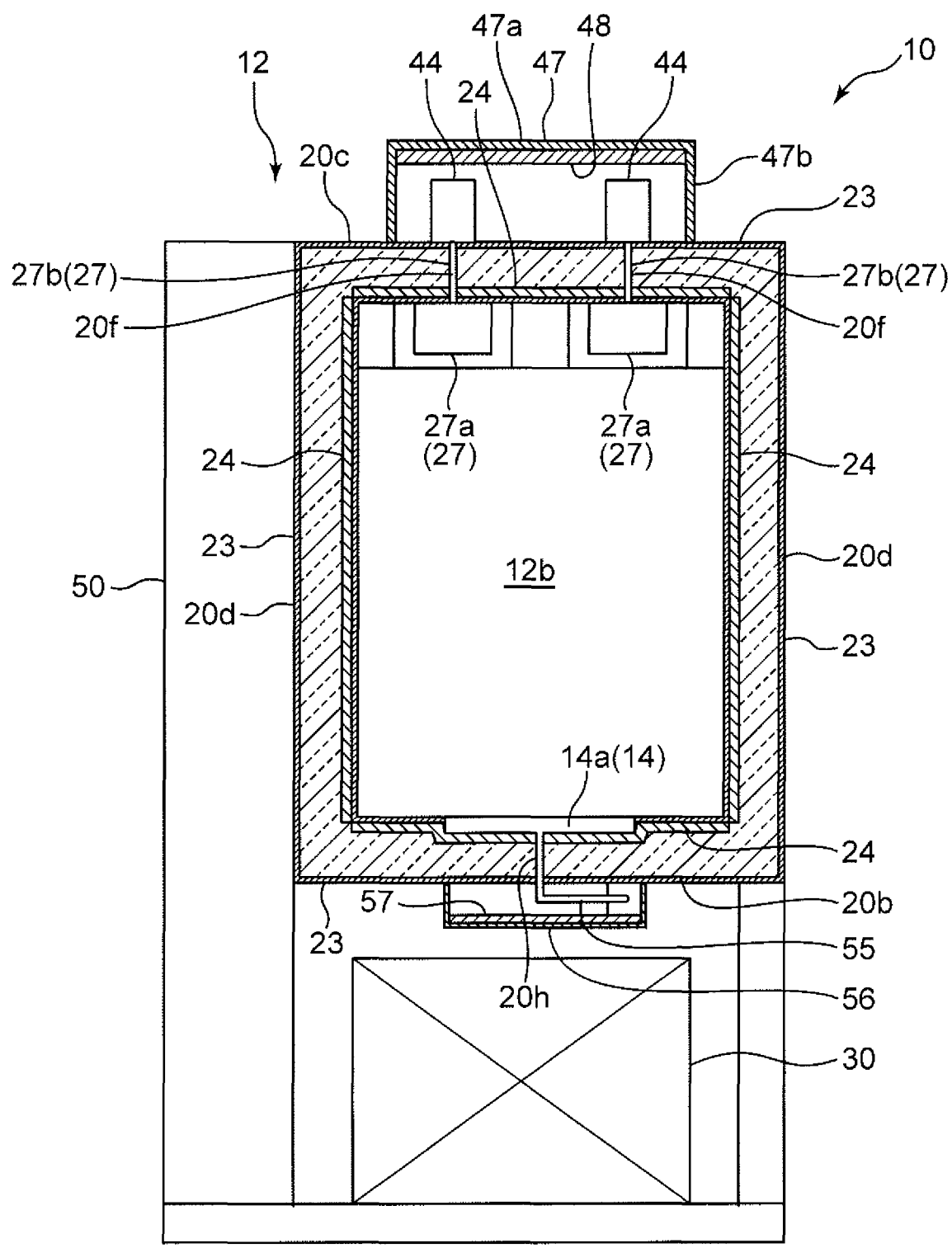
FIG. 12 is a view schematically showing the environmental testing device as viewed in the front-rear direction.

It should be understood that the embodiments disclosed herein are illustrative in all respects and not restrictive. The present invention is not limited to the above-described embodiments, and various changes, improvements, and the like can be made without departing from the scope thereof. For example, in the above embodiment, the blower 27 is configured by a cross flow fan, and the shaft 27b of the blower 27 is configured to penetrate the side wall part 20d of the heat insulation chamber 12. On the other hand, in the example illustrated in FIG. 11, the shaft 27b of the blower 27 penetrates the top surface part 20c of the heat insulation chamber 12, and the motor 44 is disposed above the top surface part 20c. The blower 27 includes, for example, a sirocco fan. In this case, as illustrated in FIG. 12, two blowers 27 may be provided.

The shield box 47 is attached to the heat insulation panel 23 so as to cover an opening provided in the heat insulation panel 23 forming the top surface part 20c. In this case, the shield box 47 can be recognized from the outside. As illustrated in FIG. 12, the shield box 47 is disposed so as to cover the two motors 44. Even in this case, the radiation-absorbent material 48 is preferably provided in the shield box 47. In the example of FIG. 12, the shield box 47 may be provided with a cooling opening (not illustrated).

As illustrated in FIG. 13, the shaft 27b of the blower 27 may penetrate the side wall part 20d on the back surface side of the heat insulation chamber 12, and the motor 44 may be disposed on the back surface of the side wall part 20d. The blower 27 includes, for example, a sirocco fan. In this case, since the shield box 47 is accommodated in the machine chamber 16, it cannot be recognized from the outside. Even in this case, the radiation-absorbent material 48 is preferably provided in the shield box 47. In the example of FIG. 13, the shield box 47 may be formed with a cooling opening (not illustrated).

In the second embodiment and the third embodiment, the radiation-absorbent material 24 disposed in the heat insulation panel 23 may be omitted. The radiation-absorbent materials 48, 53, 57, and 63 in the shield boxes 47, 52, 56, and 62 may be omitted. In the second embodiment and the third embodiment, the radiation-absorbent materials 48, 53, 57, and 63 in the shield boxes 47, 52, 56, and 62 are provided on the entire surface of the bottom surface parts 47a, 56a, and 62a opposing the heat insulation panel 23, but the present embodiment is not limited to this. The radiation-absorbent materials 48, 53, 57, and 63 may be provided in at least a part (for example, half or more) of the bottom surface parts 47a, 56a, and 62a. The radiation-absorbent materials 48, 53, 57, and 63 are not limited to the case of being arranged on the bottom surface parts 47a, 56a, and 62a, and only required to be provided at sites forming at least one surface forming the shield boxes 47, 52, 56, and 62.

In the second embodiment and the third embodiment, when the humidifier 14a and the storage portion 65 are not provided, the shield box 56 and the radiation-absorbent material 57 are omitted.

In each of the above embodiments, the conductive connection part 38 is provided in the test chamber 12a, but the present embodiment is not limited to this. The conductive connection part 38 may be disposed outside the test chamber 12a as long as the heat insulation chamber 12 in which the door 21 is in the closed position can form a Faraday cage.

In each of the above embodiments, the heat insulation panel 23 includes the outer panel 23a, the inner panel 23b, and the heat insulation material 23e, and the radiation-absorbent material 24 is disposed in this heat insulation panel 23, but the present embodiment is not limited to this configuration. For example, the heat insulation material 23c may be omitted, and the radiation-absorbent material 24 disposed between the outer panel 23a and the inner panel 23b may have a heat insulation function. When the heat insulation material 23c is provided, the radiation-absorbent material 24 may have a heat insulation function or needs not have a heat insulation function.

The embodiments will now be outlined.

(1) An environmental testing device according to the embodiments includes: a heat insulation chamber that includes a test chamber and is formed using a heat insulation panel that is electrically conductible; an air conditioner; and a blower for generating an air flow that causes air conditioned by the air conditioner to flow into the test chamber. The heat insulation chamber includes a chamber body that has an entrance, and a door that opens and closes the entrance. A heat insulation panel forming the chamber body includes an outer panel and an inner panel disposed inside the outer panel. The environmental testing device further includes a radiation-absorbent material disposed between the outer panel and the inner panel. The heat insulation panel forming the chamber body and a heat insulation panel forming the door are connected to each other in an electrically conductible manner.

In the environmental testing device, the heat insulation panel forming the chamber body and the heat insulation panel forming the door are connected to each other in an electrically conductible manner. Therefore, since the heat insulation chamber becomes electrically conductible as a whole, the electromagnetic shield effect can be obtained. Moreover, since the radiation-absorbent material is disposed between the outer panel and the inner panel forming the chamber body, radio waves repeatedly reflected between the outer panel and the inner panel are absorbed by the radiation-absorbent material. Accordingly, the radio waves can be attenuated in the heat insulation panel. Therefore, it is possible to enhance the electromagnetic shield effect in the environmental testing device. Since the radiation-absorbent material is disposed between the outer panel and the inner panel, it is not affected by the state (temperature and humidity) of air in the test chamber. Therefore, even when a high temperature test or a high humidity test is performed, it is possible to suppress deterioration of the radiation-absorbent material.

(2) The heat insulation panel forming the chamber body may be provided with an opening through which a shaft of the blower is inserted. In this case, the environmental testing device may further include a shield box that is attached to the heat insulation panel provided with the opening so as to cover the opening and is electrically conductible with the heat insulation panel.

In this aspect, it is possible not only to dispose the shaft of the blower so as to pass through the heat insulation panel, but also to suppress electromagnetic waves from leaking through the opening and electromagnetic waves from entering into the heat insulation chamber.

(3) The air conditioner may include an evaporator, and in this case, the heat insulation panel forming the chamber body may be provided with an opening through which a pipe leading to the evaporator is drawn out from the heat insulation chamber. In this case, the environmental testing device may further include a shield box that is attached to the heat insulation panel provided with the opening so as to cover the opening and at least a part of the pipe and is electrically conductible with the heat insulation panel.

In this aspect, it is possible not only to dispose the refrigerant pipe leading to the evaporator so as to pass through the heat insulation panel, but also to suppress electromagnetic waves from leaking through the opening for passing the pipe and electromagnetic waves from entering into the heat insulation chamber.

(4) An environmental testing device according to the embodiments includes: a heat insulation chamber that includes a test chamber and is formed using a heat insulation panel that is electrically conductible; an air conditioner; and a blower for generating an air flow that causes air conditioned by the air conditioner to flow into the test chamber. The heat insulation chamber includes a chamber body that has an entrance, and a door that opens and closes the entrance. A heat insulation panel forming the chamber body includes an outer panel and an inner panel disposed inside the outer panel. The heat insulation panel forming the chamber body and a heat insulation panel forming the door are connected to each other in an electrically conductible manner. The heat insulation panel forming the chamber body is provided with an opening through which a shaft of the blower is inserted. The environmental testing device further includes a shield box that is attached to the heat insulation panel provided with the opening so as to cover the opening and is electrically conductible with the heat insulation panel.

In the environmental testing device, the heat insulation panel forming the chamber body and the heat insulation panel forming the door are connected to each other in an electrically conductible manner. Therefore, since the heat insulation chamber becomes electrically conductible as a whole, the electromagnetic shield effect can be obtained. Moreover, the heat insulation panel formed with the opening through which the shaft of the blower is inserted is attached with the shield box in an electrically conductible manner with the heat insulation panel so as to cover the opening. Therefore, it is possible not only to dispose the shaft of the blower so as to pass through the heat insulation panel, but also to suppress electromagnetic waves from leaking through the opening and electromagnetic waves from entering into the heat insulation chamber. Accordingly, it is possible to enhance the electromagnetic shield effect in the environmental testing device.

(5) An environmental testing device according to the embodiment includes: a heat insulation chamber that includes a test chamber and is formed using a heat insulation panel that is electrically conductible; an air conditioner for performing air conditioning and including an evaporator for exchanging heat between a refrigerant and air to evaporate the refrigerant; and a blower for generating an air flow that causes air conditioned by the air conditioner to flow into the test chamber. The heat insulation chamber includes a chamber body that has an entrance, and a door that opens and closes the entrance. A heat insulation panel forming the chamber body includes an outer panel and an inner panel disposed inside the outer panel. The heat insulation panel forming the chamber body and a heat insulation panel forming the door are connected to each other in an electrically conductible manner. The heat insulation panel forming the chamber body is provided with an opening through which a pipe leading to the evaporator is drawn out from the heat insulation chamber. The environmental testing device further includes a shield box that is attached to the heat insulation panel provided with the opening so as to cover the opening and at least a part of the pipe and is electrically conductible with the heat insulation panel.

In the environmental testing device, the heat insulation panel forming the chamber body and the heat insulation panel forming the door are connected to each other in an electrically conductible manner. Therefore, since the heat insulation chamber becomes electrically conductible as a whole, the electromagnetic shield effect can be obtained. Moreover, the heat insulation panel formed with the opening for passing the pipe leading to the evaporator is attached with the shield box in an electrically conductible manner with the heat insulation panel so as to cover the opening. Therefore, it is possible not only to dispose the pipe leading to the evaporator so as to pass through the heat insulation panel, but also to suppress electromagnetic waves from leaking through the opening and electromagnetic waves from entering into the heat insulation chamber. Accordingly, it is possible to enhance the electromagnetic shield effect in the environmental testing device.

(6) The environmental testing device may further include a radiation-absorbent material disposed in a space defined by the shield box and the heat insulation panel provided with the opening.

In this aspect, radio waves repeatedly reflected between the shield box and the heat insulation panel are absorbed by the radiation-absorbent material. Therefore, radio waves can be attenuated in the space defined by the shield box and the heat insulation panel.

(7) The heat insulation panel forming the chamber body may be provided with an opening for passing through at least one of a water supply pipe and a drain pipe. In this case, the environmental testing device may further include a shield box that is attached to the heat insulation panel provided with the opening so as to cover the opening and is electrically conductible with the heat insulation panel.

In this aspect, it is possible not only to dispose at least one of the water supply pipe and the drain pipe so as to pass through the heat insulation panel, but also to suppress electromagnetic waves from leaking through the opening and electromagnetic waves from entering into the heat insulation chamber.

(8) The environmental testing device may further include a conductive connection part that connects, in an electrically conductible manner, the heat insulation panel forming the chamber body and the heat insulation panel forming the door to each other. In this case, the conductive connection part may include a frame member that is conductive and is disposed so as to be in contact with the heat insulation panel forming the chamber body, and a contact member that is conductive, is disposed so as to be in contact with the heat insulation panel forming the door and is in contact with the frame member when the door is at a position to close the entrance. In this case, the frame member may include a shield gasket, a body part that has a frame shape and presses the shield gasket against the heat insulation panel forming the chamber body, and a connection part that is fixed to the body part and is capable of being brought into contact with the contact member.

In this aspect, the body part that has a frame shape of the frame member presses the shield gasket against the heat insulation panel forming the chamber body. This secures electrical conduction between the frame member and the heat insulation panel of the chamber body. The contact member in contact with the heat insulation panel of the door comes into contact with the connection part of the frame member. Accordingly, the frame member becomes electrically conductible with the heat insulation panel constituting the door via the contact member.

(9) The conductive connection part may form, in the test chamber, an adjacent space that is a space adjacent to a gap between the chamber body and the door in a state where the contact member is in contact with the connection part. In this case, the adjacent space may be isolated from a main space that is a space other than the adjacent space in the test chamber.

In this aspect, since the adjacent space adjacent to the gap between the chamber body and the door is isolated from the main space other than the adjacent space in the test chamber, heat transfer from the main space to the gap between the chamber body and the door is suppressed. Therefore, the conductive connection part can contribute not only to securing of electrical conduction between the chamber body and the door but also to suppression of heat transfer from the main space to the gap between the chamber body and the door.

As described above, it is possible to enhance the electromagnetic shield effect in the environmental testing device.

This application is based on Japanese Patent Application No. 2021-131223 filed on Aug. 11, 2021, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

The invention claimed is:

1. An environmental testing device comprising:
   a heat insulation chamber that includes a test chamber and is formed using a heat insulation panel that is electrically conductible;
   an air conditioner; and
   a blower for generating an air flow that causes air conditioned by the air conditioner to flow into the test chamber, wherein
   the heat insulation chamber includes a chamber body that has an entrance, and a door that opens and closes the entrance,
   a heat insulation panel forming the chamber body includes an outer panel and an inner panel disposed inside the outer panel,
   the environmental testing device further includes a radiation-absorbent material disposed in the heat insulation panel forming the chamber body between the outer panel and the inner panel, and
   the heat insulation panel forming the chamber body and a heat insulation panel forming the door are connected to each other in an electrically conductible manner.

2. The environmental testing device according to claim 1, wherein
   the heat insulation panel forming the chamber body is provided with an opening through which a shaft of the blower is inserted, and
   the environmental testing device further includes a shield box that is attached to the heat insulation panel provided with the opening so as to cover the opening and is electrically conductible with the heat insulation panel.

3. The environmental testing device according to claim 1, wherein
   the air conditioner includes an evaporator,
   the heat insulation panel forming the chamber body is provided with an opening through which a pipe leading to the evaporator is drawn out from the heat insulation chamber, and the environmental testing device further includes a shield box that is attached to the heat insulation panel provided with the opening so as to cover the opening and at least a part of the pipe and is electrically conductible with the heat insulation panel.

4. An environmental testing device comprising:
   a heat insulation chamber that includes a test chamber and is formed using a heat insulation panel that is electrically conductible;
   an air conditioner; and
   a blower for generating an air flow that causes air conditioned by the air conditioner to flow into the test chamber, wherein
   the heat insulation chamber includes a chamber body that has an entrance, and a door that opens and closes the entrance,
   a heat insulation panel forming the chamber body includes an outer panel and an inner panel disposed inside the outer panel,
   the heat insulation panel forming the chamber body and a heat insulation panel forming the door are connected to each other in an electrically conductible manner,
   the heat insulation panel forming the chamber body is provided with an opening through which a shaft of the blower is inserted, and
   the environmental testing device further includes a shield box that is attached to the heat insulation panel provided with the opening so as to cover the opening from an outside of the heat insulation chamber and is electrically conductible with the heat insulation panel, wherein:
   the shield box is made of a conductive member, and
   a space is defined by the shield box and the heat insulation panel provided with the opening.

5. An environmental testing device comprising:
   a heat insulation chamber that includes a test chamber and is formed using a heat insulation panel that is electrically conductible;
   an air conditioner for performing air conditioning and including an evaporator for exchanging heat between a refrigerant and air to evaporate the refrigerant; and
   a blower for generating an air flow that causes air conditioned by the air conditioner to flow into the test chamber, wherein
   the heat insulation chamber includes a chamber body that has an entrance, and a door that opens and closes the entrance,
   a heat insulation panel forming the chamber body includes an outer panel and an inner panel disposed inside the outer panel, the heat insulation panel forming the chamber body and a heat insulation panel forming the door are connected to each other in an electrically conductible manner, the heat insulation panel forming the chamber body is provided with an opening through which a pipe leading to the evaporator is drawn out from the heat insulation chamber, and the environmental testing device further includes a shield box that is attached to the heat insulation panel provided with the opening so as to cover the opening and at least a part of the pipe from an outside of the heat insulation chamber and is electrically conductible with the heat insulation panel, wherein:

the shield box is made of a conductive member, and a space is defined by the shield box and the heat insulation panel provided with the opening.

6. The environmental testing device according to claim 2, further comprising a radiation-absorbent material disposed in a space defined by the shield box and the heat insulation panel provided with the opening.

7. The environmental testing device according to claim 4, further comprising a radiation-absorbent material disposed in the space defined by the shield box and the heat insulation panel provided with the opening.

8. The environmental testing device according to claim 5, further comprising a radiation-absorbent material disposed in the space defined by the shield box and the heat insulation panel provided with the opening.

9. The environmental testing device according to claim 1, wherein the heat insulation panel forming the chamber body is provided with an opening for passing through at least one of a water supply pipe and a drain pipe, and the environmental testing device further includes a shield box that is attached to the heat insulation panel provided with the opening so as to cover the opening and is electrically conductible with the heat insulation panel.

10. The environmental testing device according to claim 4, wherein the heat insulation panel forming the chamber body is provided with an opening for passing through at least one of a water supply pipe and a drain pipe, and the environmental testing device further includes a shield box that is attached to the heat insulation panel provided with the opening so as to cover the opening and is electrically conductible with the heat insulation panel.

11. The environmental testing device according to claim 5, wherein the heat insulation panel forming the chamber body is provided with an opening for passing through at least one of a water supply pipe and a drain pipe, and the environmental testing device further includes a shield box that is attached to the heat insulation panel provided with the opening so as to cover the opening and is electrically conductible with the heat insulation panel.

12. The environmental testing device according to claim 1, further comprising a conductive connection part that connects, in an electrically conductible manner, the heat insulation panel forming the chamber body and the heat insulation panel forming the door to each other, wherein the conductive connection part includes a frame member that is conductive and is disposed so as to be in contact with the heat insulation panel forming the chamber body, and a contact member that is conductive, is disposed so as to be in contact with the heat insulation panel forming the door and is in contact with the frame member when the door is at a position to close the entrance, and the frame member includes a shield gasket, a body part that has a frame shape and presses the shield gasket against the heat insulation panel forming the chamber body, and a connection part that is fixed to the body part and is configured to be brought into contact with the contact member when the door is at the position to close the entrance.

13. The environmental testing device according to claim 4, further comprising a conductive connection part that connects, in an electrically conductible manner, the heat insulation panel forming the chamber body and the heat insulation panel forming the door to each other, wherein the conductive connection part includes a frame member that is conductive and is disposed so as to be in contact with the heat insulation panel forming the chamber body, and a contact member that is conductive, is disposed so as to be in contact with the heat insulation panel forming the door and is in contact with the frame member when the door is at a position to close the entrance, and the frame member includes a shield gasket, a body part that has a frame shape and presses the shield gasket against the heat insulation panel forming the chamber body, and a connection part that is fixed to the body part and is configured to be brought into contact with the contact member when the door is at the position to close the entrance.

14. The environmental testing device according to claim 5, further comprising a conductive connection part that connects, in an electrically conductible manner, the heat insulation panel forming the chamber body and the heat insulation panel forming the door to each other, wherein the conductive connection part includes a frame member that is conductive and is disposed so as to be in contact with the heat insulation panel forming the chamber body, and a contact member that is conductive, is disposed so as to be in contact with the heat insulation panel forming the door and is in contact with the frame member when the door is at a position to close the entrance, and the frame member includes a shield gasket, a body part that has a frame shape and presses the shield gasket against the heat insulation panel forming the chamber body, and a connection part that is fixed to the body part and is configured to be brought into contact with the contact member when the door is at the position to close the entrance.

15. The environmental testing device according to claim 12, wherein the conductive connection part forms, in the test chamber, an adjacent space that is a space adjacent to a gap between the chamber body and the door in a state where the contact member is in contact with the connection part, and the adjacent space is isolated from a main space that is a space other than the adjacent space in the test chamber.

16. The environmental testing device according to claim 13, wherein the conductive connection part forms, in the test chamber, an adjacent space that is a space adjacent to a gap between the chamber body and the door in a state where the contact member is in contact with the connection part, and the adjacent space is isolated from a main space that is a space other than the adjacent space in the test chamber.

17. The environmental testing device according to claim 14, wherein the conductive connection part forms, in the test chamber, an adjacent space that is a space adjacent to a gap between the chamber body and the door in a state where the contact member is in contact with the connection part, and the adjacent space is isolated from a main space that is a space other than the adjacent space in the test chamber.

* * * * *